United States Patent
Mouli (10) Patent No.: US 7,649,201 B2
(45) Date of Patent: Jan. 19, 2010

(54) RAISED PHOTODIODE SENSOR TO INCREASE FILL FACTOR AND QUANTUM EFFICIENCY IN SCALED PIXELS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 484 days.

(21) Appl. No.: 11/399,372

(22) Filed: Apr. 7, 2006

(65) Prior Publication Data

US 2006/0175641 A1 Aug. 10, 2006

Related U.S. Application Data

(62) Division of application No. 10/857,876, filed on Jun. 2, 2004, now Pat. No. 7,285,796.

(51) Int. Cl.
*H01L 31/06* (2006.01)
(52) U.S. Cl. ............... 257/53; 257/292; 257/E31.047; 257/440
(58) Field of Classification Search ......... 257/292–293, 257/458, 53, E31.047
See application file for complete search history.

(56) References Cited

U.S. PATENT DOCUMENTS

| | | | |
|---|---|---|---|
| 6,018,187 A | | 1/2000 | Theil et al. |
| 6,043,427 A * | | 3/2000 | Nishimoto ............ 136/258 |
| 6,389,317 B1 | | 5/2002 | Chow et al. |
| 6,627,475 B1 | | 9/2003 | Yang et al. |
| 6,730,900 B2 * | | 5/2004 | Hsish et al. ............ 250/208.1 |
| 6,791,130 B2 * | | 9/2004 | Chao et al. ............ 257/233 |
| 2004/0041224 A1 * | | 3/2004 | Chao et al. ............ 257/444 |
| 2004/0232456 A1 * | | 11/2004 | Hong ............ 257/257 |
| 2005/0104089 A1 * | | 5/2005 | Engelmann et al. ...... 257/204 |

OTHER PUBLICATIONS

J. Theil, "Monolithic Instruments (New opportunities for wafer fabs)" Nov. 12, 2003.
B.P. Nelson et al., "Project Summary of the NREL Amorphous Silicon Team" Mar. 24, 2003.
Kangguo Cheng, et al., "Improved Hot-Carrier Reliability of SOI Transistors", IEEE, vol. 49, No. 3, Mar. 2002, p. 529.
J.M. Shannon, "Electronic Effects of Light . . . ", Solid State Electronics, vol. 47 (2003) p. 1903.
A. Stesman, "Revision of H2 Passivation . . . ", Applied Physics Letter, vol. 68 (1996) p. 2723.

* cited by examiner

*Primary Examiner*—Allan R. Wilson
(74) *Attorney, Agent, or Firm*—Dickstein Shapiro LLP (57) ABSTRACT

An image pixel cell with a doped, hydrogenated amorphous silicon photosensor, raised above the surface of a substrate is provided. Methods of forming the raised photosensor are also disclosed. Raising the photosensor increases the fill factor and the quantum efficiency of the pixel cell. Utilizing hydrogenated amorphous silicon decreases the leakage and barrier problems of conventional photosensors, thereby increasing the quantum efficiency of the pixel cell. Moreover, the doping of the photodiode with inert implants like fluorine or deuterium further decreases leakage of charge carriers and mitigates undesirable hysteresis effects.

25 Claims, 12 Drawing Sheets

RAISED PHOTODIODE SENSOR TO INCREASE FILL FACTOR AND QUANTUM EFFICIENCY IN SCALED PIXELS

The present application is a divisional of application Ser. No. 10/857,876, filed Jun. 2, 2004 now U.S. Pat. No. 7,285,796, the entire disclosure of which is incorporated herein by reference.

FIELD OF THE INVENTION

The present invention relates generally to digital image sensors and methods of fabrication thereof and in particular to photosensors used in a pixel sensor cell.

BACKGROUND OF THE INVENTION

Typically, a digital imager array includes a focal plane array of pixel cells, each one of the cells including a photosensor, e.g. a photogate, photoconductor, or a photodiode. In a CMOS imager a readout circuit is connected to each pixel cell which typically includes a source follower output transistor. The photosensor converts photons to electrons which are typically transferred to a floating diffusion region connected to the gate of the source follower output transistor. A charge transfer device (e.g., transistor) can be included for transferring charge from the photosensor to the floating diffusion region. In addition, such imager cells typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, each assigned to Micron Technology, Inc. The disclosures of each of the forgoing patents are hereby incorporated by reference in their entirety.

In a digital CMOS imager, when incident light strikes the surface of a photodiode photosensor, electron/hole pairs are generated in the p-n junction of the photodiode. The generated electrons are collected in the n-type region of the photodiode. The photo charge moves from the initial charge accumulation region to the floating diffusion region or the charge may be transferred to the floating diffusion region via a transfer transistor. The charge at the floating diffusion region is typically converted to a pixel output voltage by a source follower transistor.

Conventional CMOS imagers typically have difficulty transferring all of the photogenerated charge from the photodiode to the floating diffusion region. One problem with transferring charge occurs when the n-type silicon layer of the photodiode is located close to the surface; this causes electron/carrier recombination due to surface defects. There is a need to reduce this electron/carrier recombination to achieve good charge transfer to the floating diffusion region. Another obstacle hindering "complete" charge transference includes potential barriers that exist at the gate of a transfer transistor.

Figure 1:
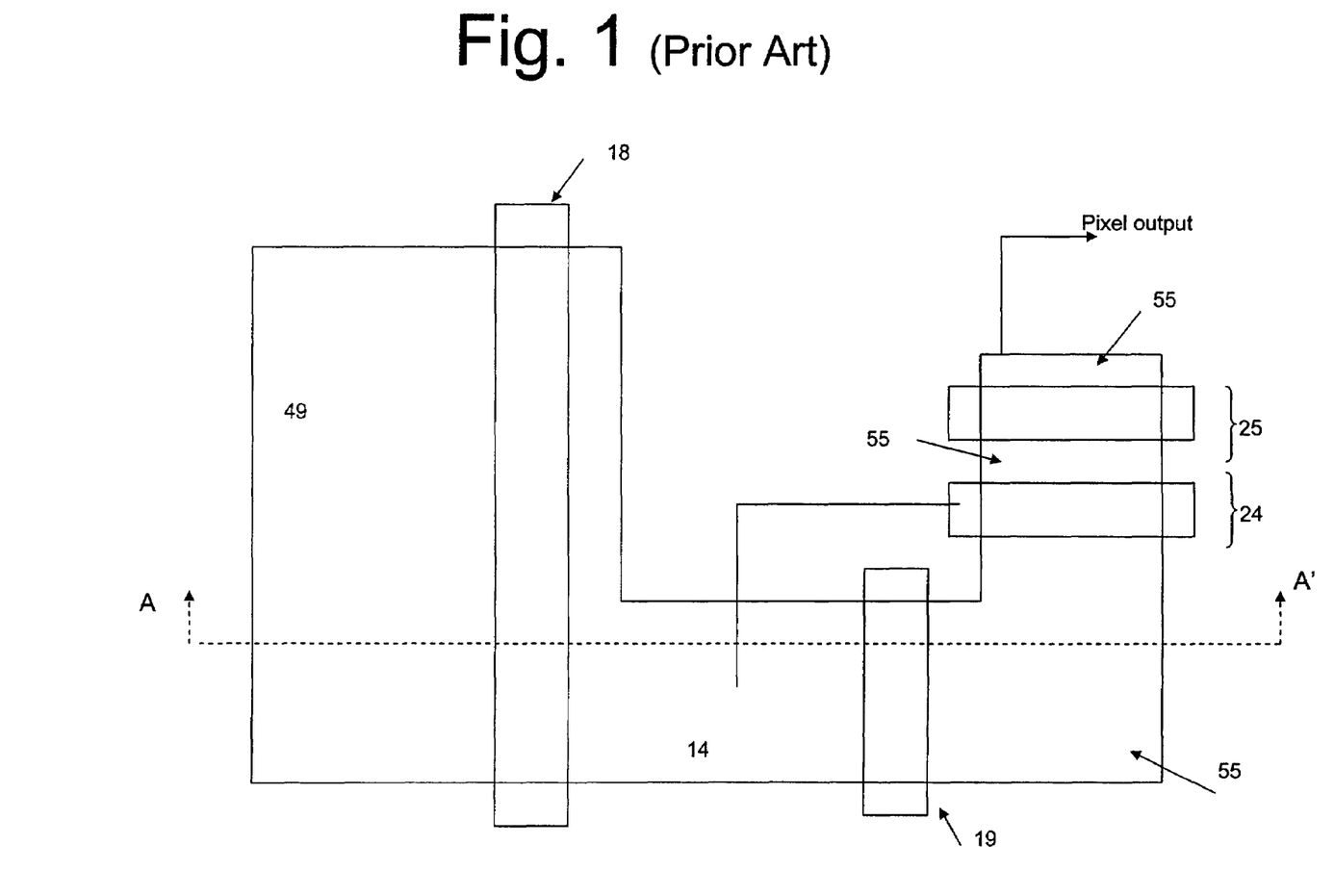
FIG. 1 is a top plan view of a conventional CMOS pixel cell.

Additionally, conventional CMOS imager designs provide only approximately a fifty percent fill factor, meaning only half of the pixel is utilized in converting light to charge carriers. As shown in FIG. 1, a top plan view of a conventional CMOS pixel sensor cell, only a small portion of the cell comprises a photosensor (photodiode) 49. The remainder of the cell includes the floating diffusion region 14, coupled to a transfer gate 18, and source/drain regions 55 for reset, source follower, and row select transistors having respective gates 19, 24, and 25. It is desirable to increase the fill factor of the conventional cell.

Figure 2:
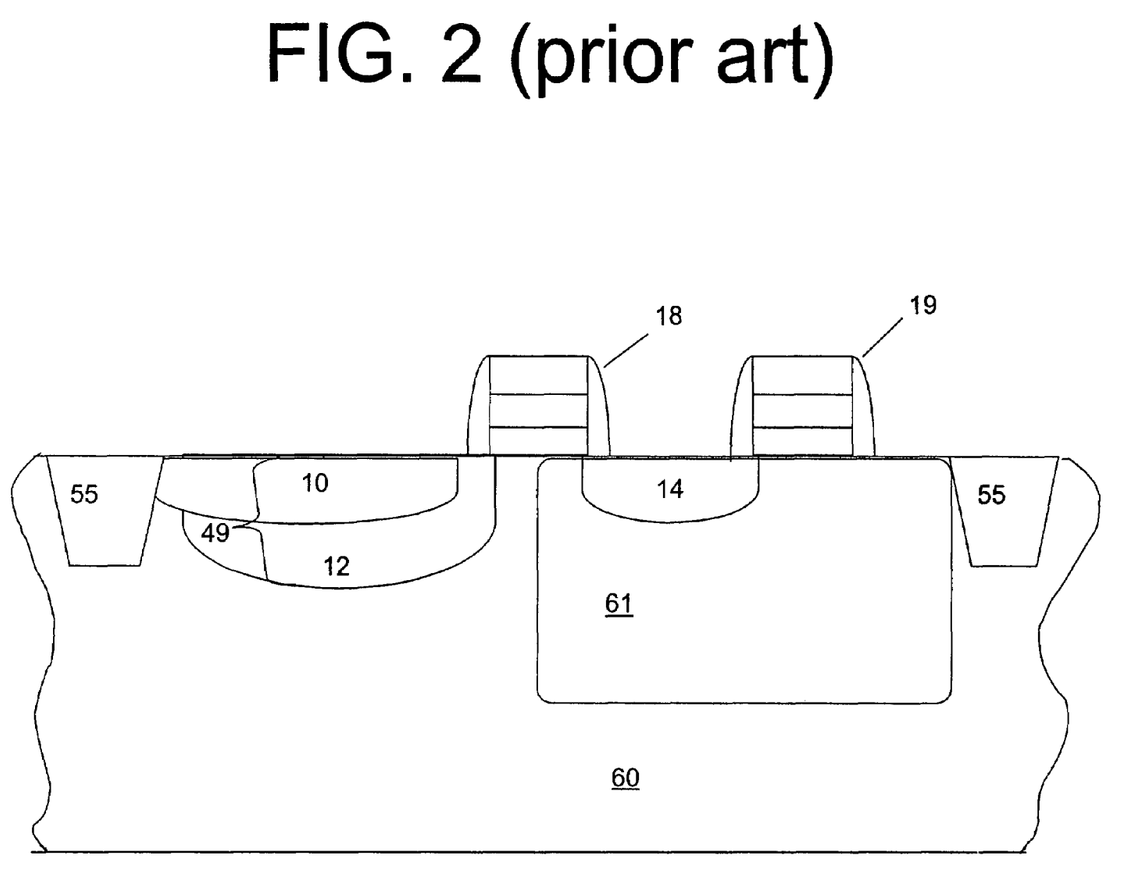
FIG. 2 is a cross-sectional view of the pixel cell of FIG. 1, taken along line A-A'.

Digital imagers may utilize a pixel containing a p-n-p photodiode 49 as the photo-conversion device. An example of this design is shown in FIG. 2, a cross-sectional view of the pixel of FIG. 1, taken along line A-A'. The pixel sensor cell shown in FIG. 2 has a p-type substrate 60 with a p-well 61. In the illustrated example, a p-type region 10 of photodiode 49 is located closest to the surface of substrate 60 and an n-type region 12 is buried between the p-type region 10. The p-n-p photodiode 49 has some drawbacks. First, there can be a lag problem since the pixel uses a transfer transistor 18 for transferring charge to the floating diffusion region 14. Lag occurs because during integration the electron carriers are collected in the sandwiched n-type region 12 and then transferred to the floating diffusion region 14 through a transfer gate 18. In order to fully utilize the generated electron carrier, it is necessary to eliminate two energy barriers to reach the floating diffusion region 14 (i.e., there is one barrier between the photodiode 49 and the transfer gate 18 and another barrier between the transfer gate 18 and floating diffusion region 14). Next, charge leakage is another problem associated with the conventional p-n-p photodiode 49. One source of such leakage occurs when the transfer transistor 18 gate length is too short, causing sub-threshold current to become significantly high due to charge breakdown between n-type regions on both sides of the transfer gate channel.

Additionally, as the total area of pixels continues to decrease (due to desired scaling), it becomes increasingly important to create high sensitivity photosensors that utilize a minimum amount of surface area. Raised photodiodes have been proposed as a way to increase the fill factor and optimize the sensitivity of the CMOS pixel by increasing the sensing area of the cell without increasing the surface area of the substrate. Further, raising the photodiode increases the quantum efficiency of the cell by bringing the sensing region closer to the microlens. However, raised photodiodes, such as described in U.S. application Ser. No. 10/443,891, assigned to Micron Technology, Inc., and incorporated herein by reference, also have problems with leakage current across the elevated p-n junctions. Accordingly, a raised photosensor that reduces this leakage, while increasing the quantum efficiency of the pixel cell, is desired.

SUMMARY OF THE INVENTION

The present invention provides embodiments of image pixel cells with a doped, hydrogenated amorphous silicon photosensor, raised above the surface of a substrate. Methods of forming the raised photosensor are also disclosed. Raising the photosensor increases the fill factor and the quantum efficiency of the pixel cell. Utilizing hydrogenated amorphous silicon decreases the leakage and barrier problems of conventional photosensors, thereby increasing the quantum efficiency of the pixel cell. Moreover, the doping of the photodiode with inert implants like fluorine or deuterium further decreases leakage of charge carriers and mitigates undesirable hysteresis effects.

Additional features and advantages of the present invention will be apparent from the following detailed description and drawings which illustrate exemplary embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Figure 3:
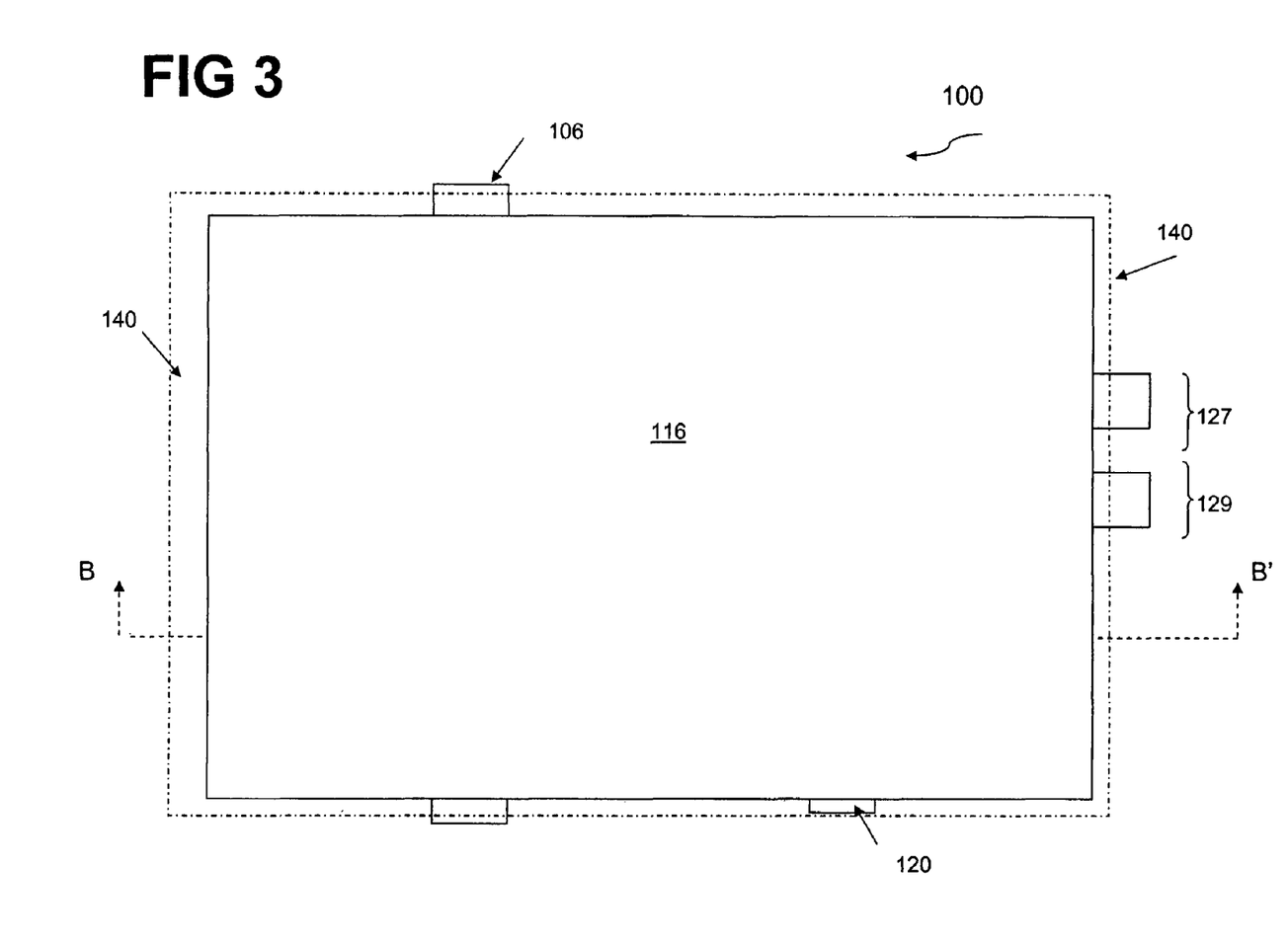
FIG. 3 is a top plan view of a pixel cell constructed in accordance with an exemplary embodiment of the invention.

In the following description, the invention is described in relation to a CMOS imager for convenience purposes only; the invention, however, has wider applicability to any photosensor of any imager cell. Now referring to the figures, where like numerals designate like elements, FIG. 3 illustrates a pixel sensor cell 100 constructed in accordance with a first exemplary embodiment of the invention. From the top plan view of the pixel cell 100, only the raised photodiode region 122 and the cell insulation region 140 can be seen. The fill factor of the cell 100 is nearly 100 percent, as the photosensing region covers the entire surface area of the cell. Although FIG. 3 shows the invention raised photodiode region 122 as covering the entire pixel, the raised photosensing region of the present invention could have a smaller surface area and could cover much less of pixel sensor cell 100. Also shown in FIG. 3 is an insulating layer 140 surrounding the raised photodiode so as to insulate each pixel cell 100 from one another. Alternatively, isolation trenches or regions (not shown) are formed in the raised photodiode region 122 to provide isolation of the raised photodiode 122 of a pixel cell 100 from raised portions of adjacent cells.

Figure 4:
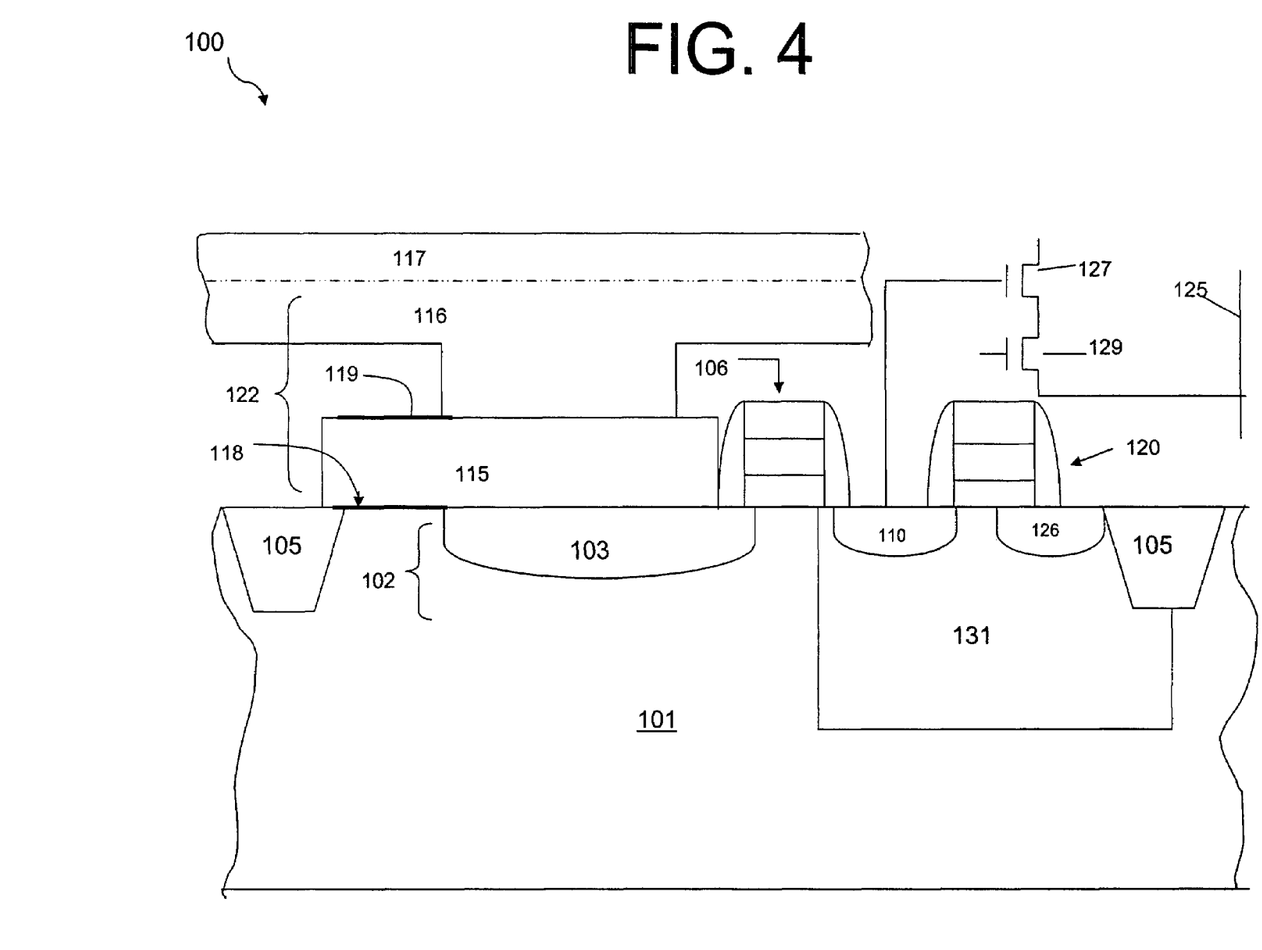
FIG. 4 is a cross-sectional view of the exemplary pixel cell of FIG. 3, taken along line B-B'.

FIG. 4 illustrates a cross-sectional view of the exemplary pixel sensor cell 100, taken along line B-B' of FIG. 3. A photosensor 102 having a doped region 103 is formed in a substrate 101. The photosensor 102 is a photodiode and may be a pinned p-n-p, n-p-n, p-n or n-p junction photodiode, a Schottky photodiode, or any other suitable photodiode. For exemplary purposes only, the illustrated photodiode 102, is a n-p photodiode, and substrate 101 is illustrated as a p-type substrate.

FIG. 4 also illustrates a floating diffusion region 110 and shallow trench isolation (STI) 105 in the substrate 101. A drain region 126 is also formed in the substrate 101. Other structures of pixel cell 100 include a transfer transistor gate 106. Reset transistor 120 comprises a similar gatestack as that of the transfer transistor 106. For clarity purposes, other transistors such as source follower transistor 127 and a row select transistor 129 are represented in electrical schematic form with the output of the row select transistor 129 being connected to a column line 125. The pixel cell 100 can be implemented as a 4T configuration or in a design with either a higher or lower number of transistors (e.g., 3T, 5T, 6T).

As shown in FIG. 4, substrate 101 has a first surface level 118. An epitaxial layer 115 is grown from the top of this first surface level 118 to a second surface level 119. Above the epitaxial layer 115 is a hydrogenated amorphous silicon layer 116. An additional hydrogenated amorphous silicon layer 117 may also be utilized if desired. In accordance with the invention, the term "hydrogenated amorphous silicon" means either conventional hydrogenated amorphous silicon (represented a-Si:H) or deuterated amorphous silicon (represented a-Si:D), having deuterium substituted for hydrogen, as discussed in more detail below.

The epitaxial layer 115 and the hydrogenated amorphous silicon layer 116 are doped such that the layers have opposite doping types to create a p-n junction above the surface level 118 of the substrate. This creates, in effect, an elevated photodiode 122. In this illustration, the epitaxial layer is doped p-type, creating a p-n junction with the n-type surface region 103. Thus, the hydrogenated amorphous silicon layer 116 would be doped n-type. There are several advantages of having a photodiode 122 constructed in accordance with the invention.

Elevating the photodiode 122 above the surface 118 of the substrate 101 makes a much larger surface area available for exposure to light. For instance, FIG. 1 shows that in a conventional pixel cell only the photodiode 49 is exposed to light and useful for generating charge. As discussed above the pixel cell of FIG. 1 has approximately a fifty percent fill factor. As shown in FIG. 3, the present invention allows for a higher fill factor by elevating the photodiode 122 above the surface level 118 to increase the sensing surface area of the cell 100. Raising the photodiode 122 also increases the quantum efficiency of the cell 100, as the light-sensing portion (the photodiode) 122 is moved closer to the lens (not shown). The use of hydrogenated amorphous silicon in the photodiode decreases the leakage current compared with the traditional leakage effect seen when amorphous silicon is used.

Furthermore, implanting inert species like fluorine or deuterium in the hydrogenated amorphous silicon layer 116 provides additional benefit. It has been shown that fluorine implants in hydrogenated amorphous silicon reduce leakage in the silicon by up to five orders of magnitude by breaking silicon-silicon bonds during the ion implementation. See, for example, Shannon et al., "Electronic Effects of Light Ion Damage in Hydrogenated Amorphous Silicon," *Solid State Electronics* vol. 47, p. 1903 (2003), incorporated herein by reference. Similarly, deuterated amorphous silicon (a-Si:D) shows better leakage properties due to reduced trap sites and better passivation.

Figure 5A:
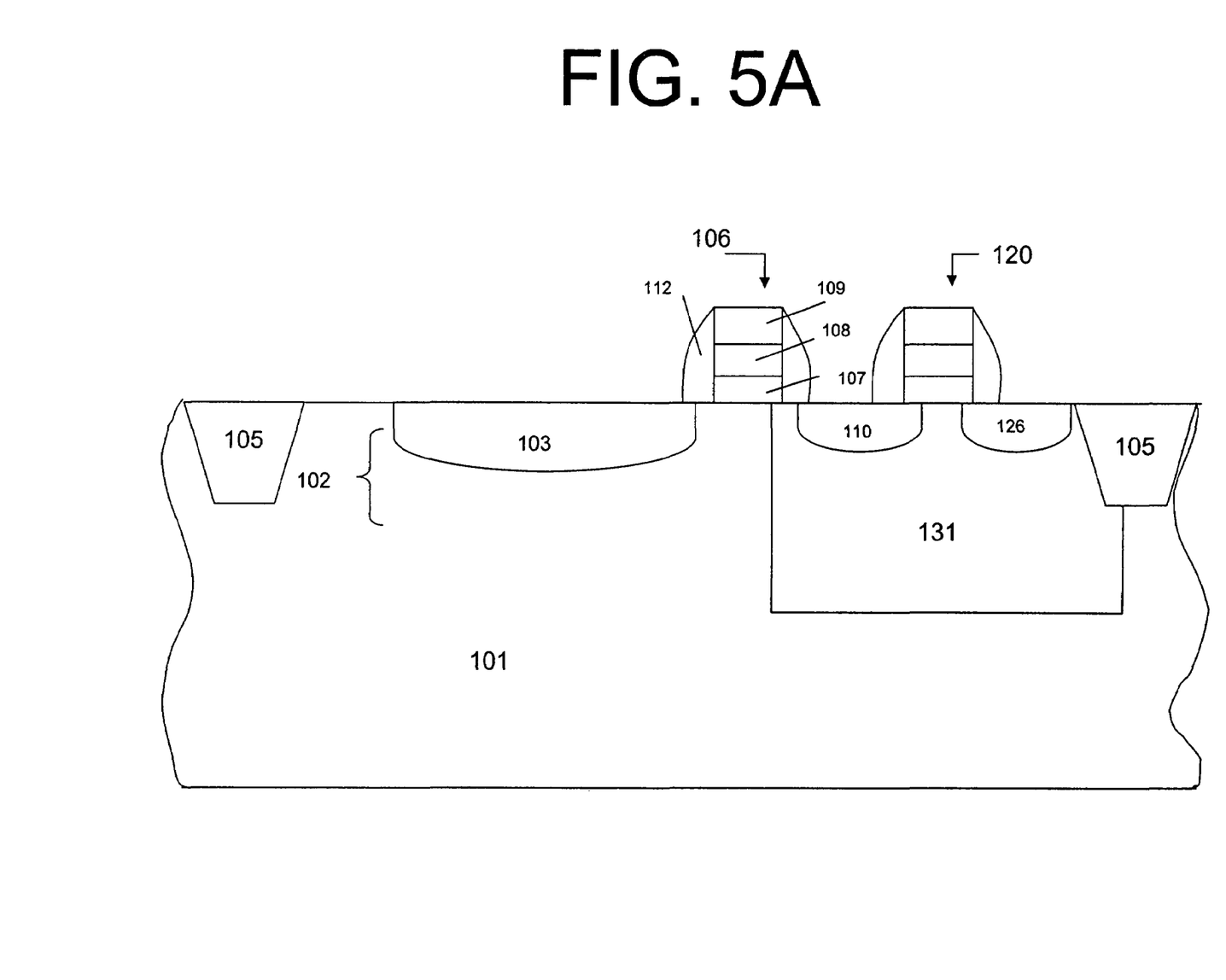
FIG. 5A is a cross-sectional view of the exemplary pixel cell of FIG. 4 during an initial stage of processing performed in accordance with the invention.

FIG. 5A shows an exemplary pixel of the present invention at an initial stage of fabrication. In a p-type substrate 101, a separate p-well 131 is formed therein. As known in the art, multiple high energy implants may be used to tailor the profile and position of the p-type well 131; typically, the p-well region 131 will have a higher dopant concentration than the p-type substrate 101. A floating diffusion region 110 is formed in the p-well 131, and is doped n-type in this embodiment.

Isolation regions 105 are etched into the surface of the substrate 101, by any suitable method or technique, and are filled with an insulating material to form an STI isolation region. The isolation regions may be formed either before or after formation of the p-well 131. A photodiode 102 is formed, in this embodiment, by creating a n-type region 103 in the p-type substrate 101. Photodiode 102 is not, however, limited to an n-p design and may be any type of photosensor as discussed herein.

Also shown in FIG. 5A, a transfer transistor gate 106 and a reset transistor gate 120 are formed at the surface of the substrate between the photodiode 102 and floating diffusion region 110. The transfer and reset transistor gates 106, 120 comprise an insulating or oxide layer 109 over a conductive layer 108 formed over a gate oxide layer 107 at the surface of the substrate 101. Preferably, the conductive layer 108 comprises a silicide or silicide/metal alloy. These layers 107, 108, 109 may, however, be formed of any suitable material using any suitable method, and do not in any way limit the scope of this invention. Completion of the transistor gates 106, 120 includes the addition of oxide spacers 112 on at least one side of the transistor gatestack. The spacers 112 may be formed of any suitable material, including, but not limited to silicon dioxide. As desired, other transistor gates (depicted in FIG. 4) may be erected simultaneously with transfer transistor gate 106 and reset transistor gate 120 during this step in the formation, and may or may not contain the same layer combinations as these gate stacks.

Figure 5B:
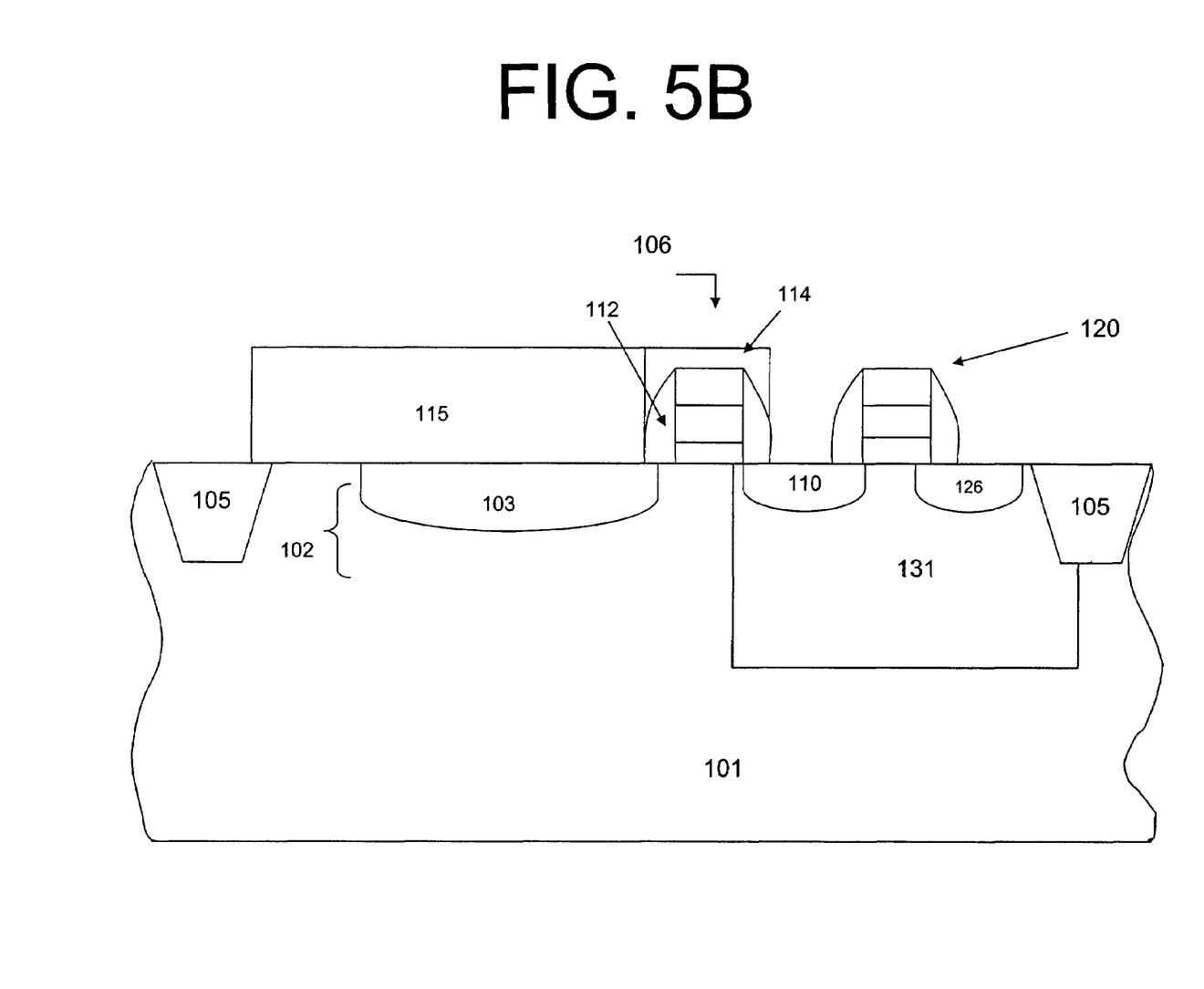
FIG. 5B shows the exemplary pixel cell of FIG. 4 at a stage of processing subsequent to that shown in FIG. 5A.

Referring now to FIG. 5B, a selective epitaxial layer 115 is grown near the surface of the substrate 101, over the photodiode 102 and adjacent the sidewall 112 of the transfer transistor gate 106. The epitaxial layer 115 is grown over this selected region using a hard mask, for example, a nitride film, to cover other regions of the substrate such as the floating diffusion region 110. By performing a chemical vapor deposition process, the epitaxial layer 115 may be formed using any suitable precursor (e.g., silicon tetrachloride, silane, and dichlorosilane). In addition, the epitaxial layer 115 can be doped as either n-type or p-type by the addition of a suitable dopant gas into the deposition reactants. In this embodiment, the epitaxial layer 115 is doped p-type, to create a p-n junction at the intersection of the epitaxial layer 115 with the surface layer 103. The epitaxial layer 115 is planarized using chemical mechanical polishing (CMP) to a height of about 500-1000 Angstroms above the surface of the substrate. An oxide cap 114 may be used to cover gate stacks to act as a CMP stop.

Figure 5C:
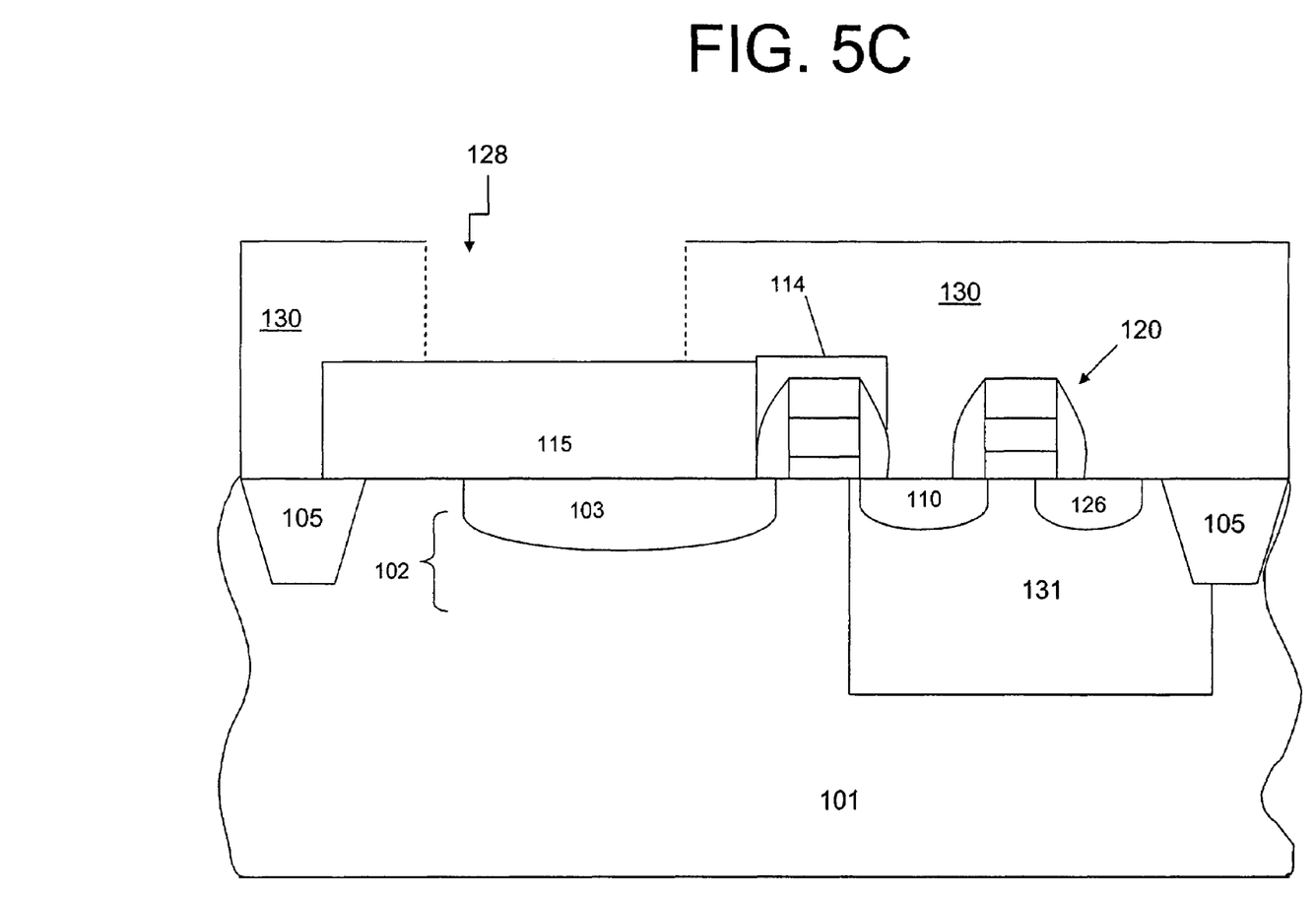
FIG. 5C shows the exemplary pixel cell of FIG. 4 at a stage of processing subsequent to that shown in FIG. 5B.

Subsequently, as shown in FIG. 5C, a buffer layer 130 (e.g., TEOS or BPSG) is deposited over the entire substrate 101. An opening 128 is then patterned in the layer 130 paralleling the photodiode 102 in the substrate 101.

Figure 5D:
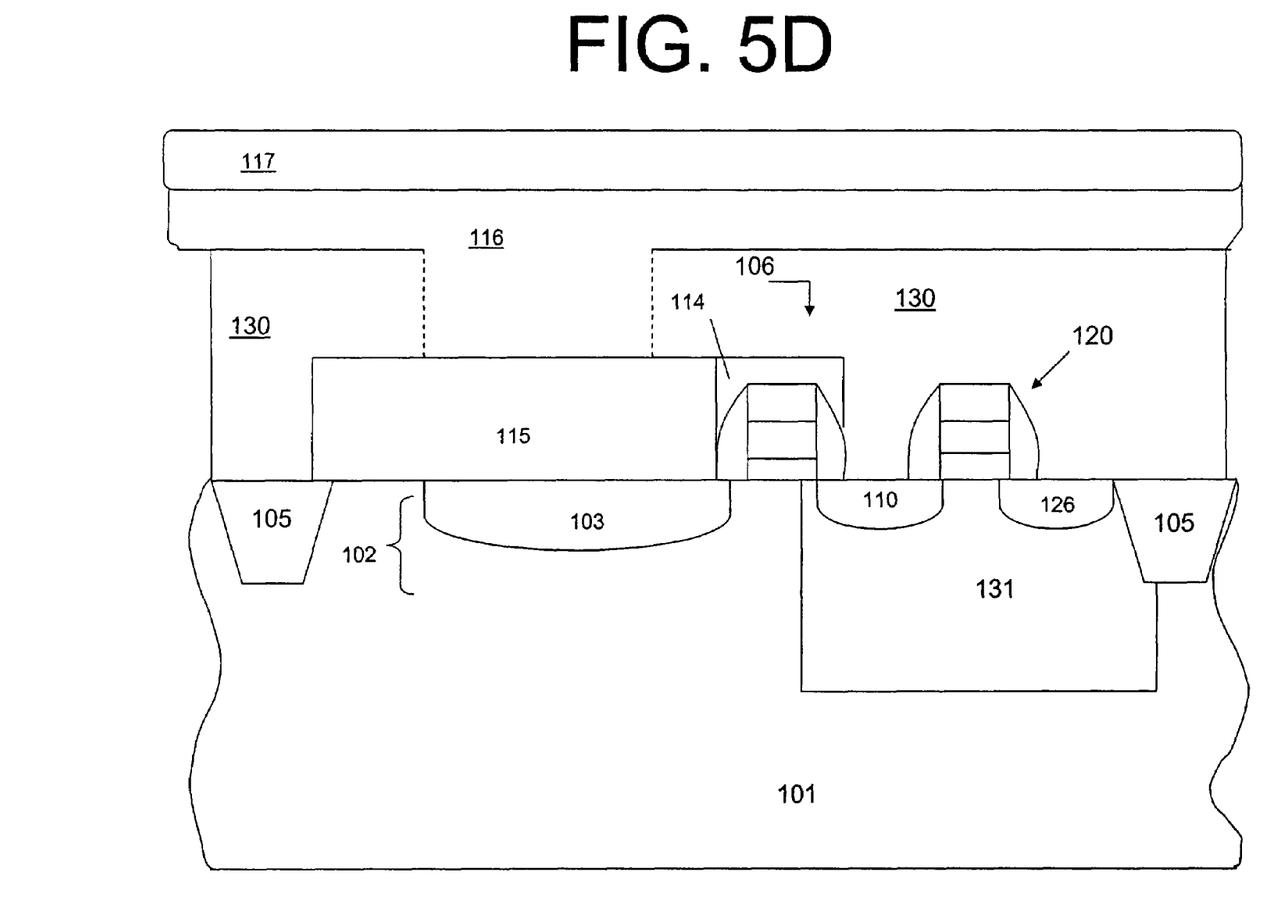
FIG. 5D shows the exemplary pixel cell of FIG. 4 at a stage of processing subsequent to that shown in FIG. 5C.

Referring now to FIG. 5D, hydrogenated amorphous silicon is deposited to fill the opening 128 and to cover the buffer layer 130, creating a raised layer 116. The layer 116 is then planarized to a thickness of about 500-1000 Angstroms. A second hydrogenated amorphous silicon layer 117 may be deposited on top of layer 116. Oppositely doping these layers 116, 117, respectively p-type and n-type, will create an additional p/n junction raised above the photodiode 102. Alternatively, the two amorphous silicon layers 116, 117 may be doped the same type (either n-type or p-type depending on the dopant used for the surface region 103 and epitaxial region 115) as to create effectively one layer. The concentration levels of dopants may be similar to that of a conventional photodiode. A preferable concentration for the top layer 117 is between about $1.0e^{20}$ to about $5.0e^{17}$, about $1.0e^{17}$ to about $5.0e^{16}$ for the first amorphous silicon layer 116, and about $1.0e^{16}$ to about $5.0e^{15}$ for the epitaxial layer 115. (All concentrations given in units of atoms per $cm^3$).

Next, the amorphous silicon layers 116, 117 are implanted with either fluorine ions or deuterium. The fluorine ions may be implanted using any suitable fluorinated gas (e.g., $SiF_2$). The implantation of fluorine may be followed by an annealing step. The deuterated amorphous silicon can be formed by utilizing a trideuterioammonia (ND3) anneal. The deuterium replaces existing hydrogen atoms in the hydrogenated amorphous silicon bonds, according to the following equation: Si—H+$D_2$=Si-D+HD. Using conventional masking techniques, the amorphous silicon layers 116, 117 can be patterned as desired.

At this stage, the formation of the exemplary pixel sensor cell 100 (FIG. 4) is essentially complete. Additional processing steps may be used to form insulating, shielding, and metallization layers as desired. For example, an inter-level dielectric (ILD) such as insulating layer 140 (FIG. 3) may be formed in order to provide adequate insulation between metallized layers as well as to isolate the amorphous silicon layers 116, 117 of a pixel cell 100 from adjacent pixel cells. Because an increased percentage of each pixel sensor cell is covered by photo-sensing material in accordance with this invention, transparent metallization layers may be used, so that light is not blocked for the photosensor. Conventional layers of conductors and insulators (not shown) may also be used to interconnect the structures and to connect the pixel to peripheral circuitry.

Figure 6:
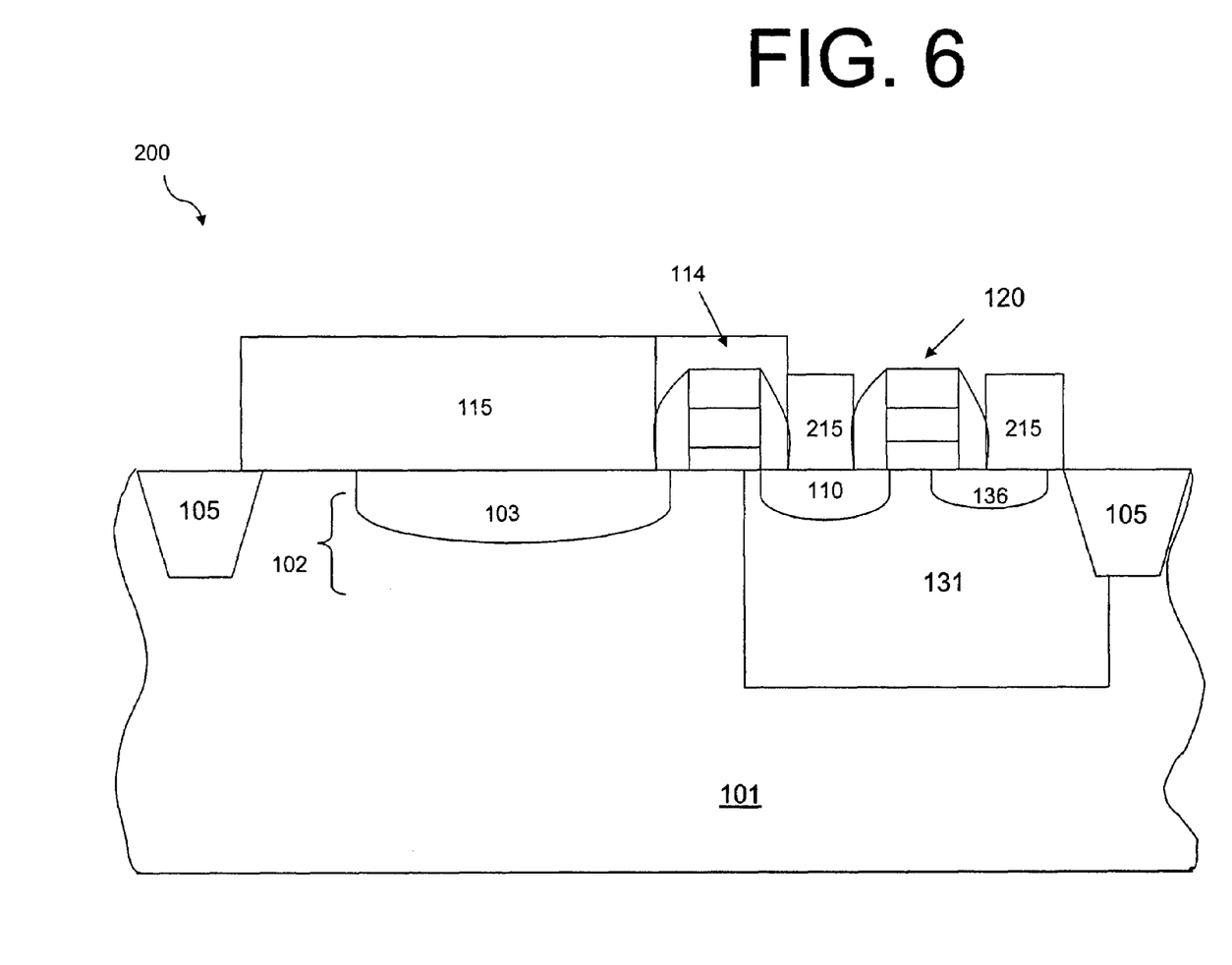
FIG. 6 shows an exemplary pixel cell constructed in accordance with a second embodiment of the invention during a stage of processing.
Figure 7:
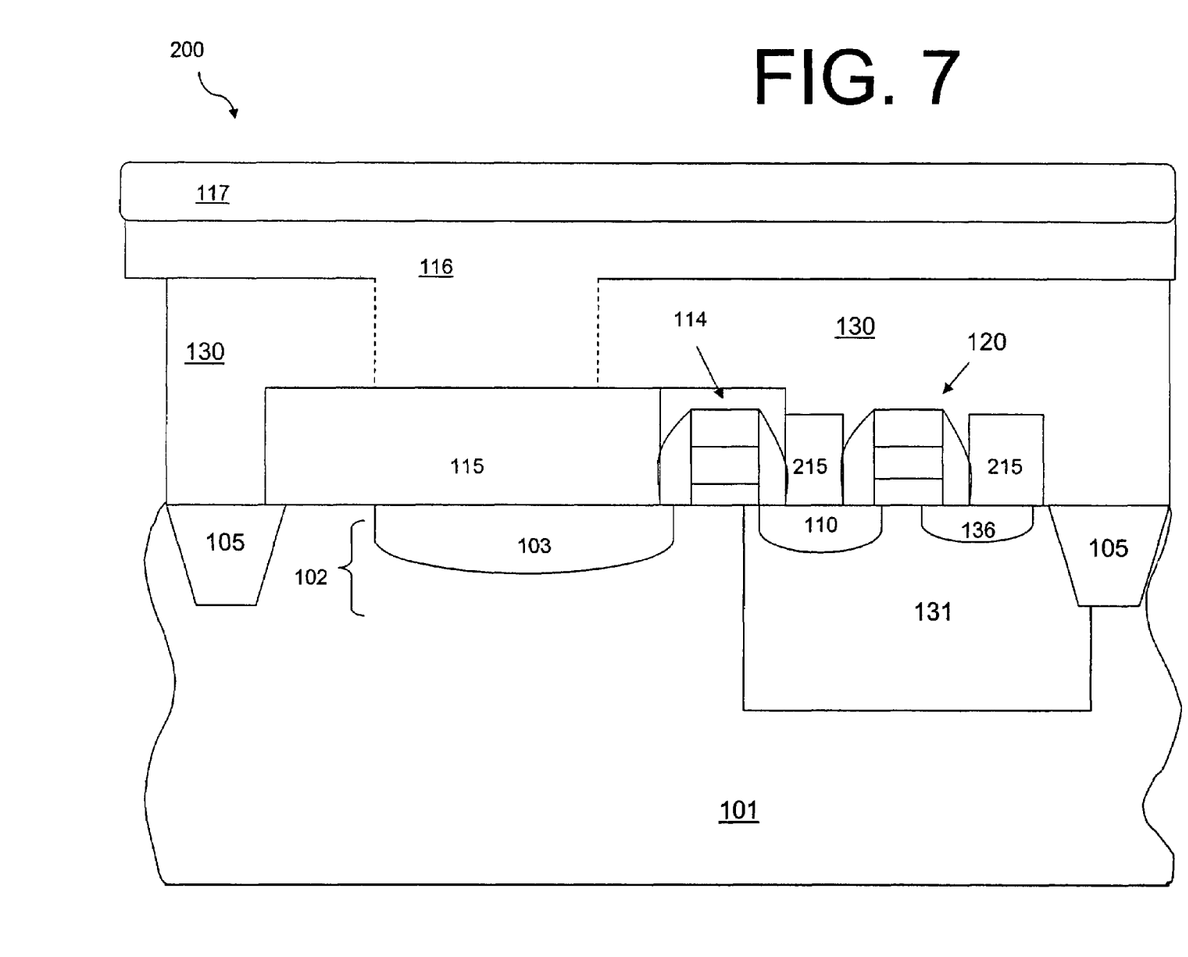
FIG. 7 shows the exemplary pixel cell of FIG. 6 at a stage of processing subsequent to that shown in FIG. 6.

FIGS. 6 and 7 illustrate a second exemplary embodiment of the current invention. The process steps for forming the exemplary pixel cell 200 are similar to the process shown in FIGS. 5A-5D, with the following exceptions. As shown in FIG. 6, the epitaxial layer comprises two enumerated regions 115, 215, as the epitaxial layer is grown not only over the photodiode region 102 of the substrate, but also over the floating diffusion region 110 and the drain region 136 for the reset transistor 120. The epitaxial layer 115 corresponds to the epitaxial layer 115 described with reference to FIGS. 4-5D. Epitaxial layer 215 is formed just as layer 115 but over the floating diffusion 110 and drain region 136 for the reset transistor 120. As explained above, this selective growth can be accomplished using any suitable masking technique. This growth effectively creates an elevated source/drain region 215 for the reset transistor 120. Accordingly, the drain region 136 in the substrate 101 has a shallower junction depth into p-well 131. As before, the epitaxial layer 115 above the photodiode region 102 is doped p-type if surface region 103 is doped n-type. The epitaxial layer 215 is doped n-type, preferably n+ doped. Source/drain region 136 is illustratively n-LDD (n-type lightly doped drain region) in this embodiment.

FIG. 7 shows completion of the second exemplary pixel cell 200 from the fabrication stage shown in FIG. 6. A suitable buffer layer 130 is deposited and patterned to create an opening in the buffer layer 130 above the epitaxial growth 115. A first hydrogenated amorphous silicon layer 116 is formed in the opening and over the buffer layer 130. A second hydrogenated amorphous silicon layer 117 is formed above the first layer 116. Epitaxial layers 116 and 117 are doped either n-or p-type depending on the doping profile of the substrate 101 and epitaxial layer 115. Finally, as discussed above, either deuterium or fluorine is implanted into layers 116 and 117 in order to decrease charge leakage across these layers.

The invention as described and illustrated above utilizes a silicon type substrate 101. Alternatively, the invention may be implemented as a SOI (silicon on insulator) design, utilizing any suitable insulating layer sandwiched between the substrate and an additional silicon layer. The other wafer structures discussed previously, such as SOS and germanium substrates, may also be used.

Figure 8:
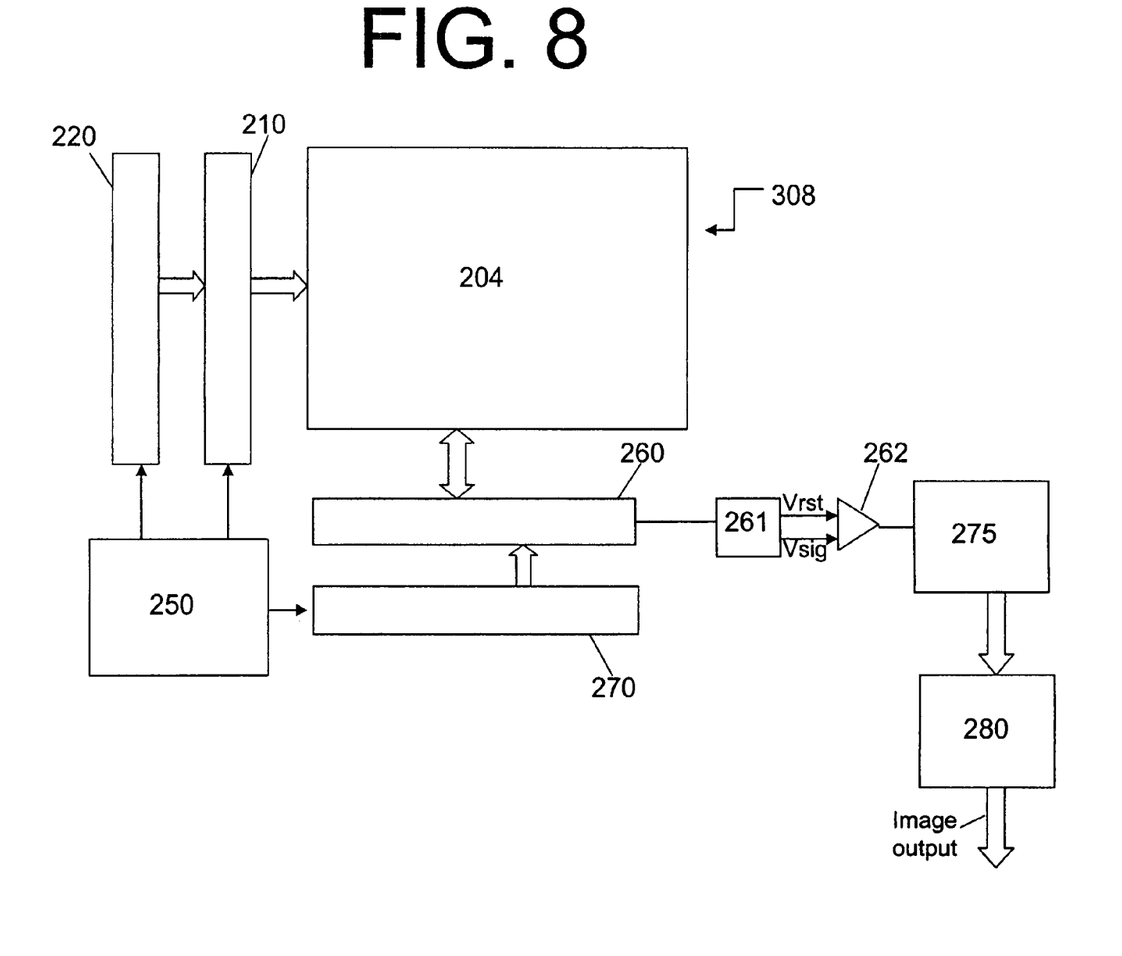
FIG. 8 is a block diagram of a CMOS imager chip having an array of pixel sensor cells constructed in accordance with the present invention.

FIG. 8 illustrates a block diagram of an exemplary CMOS imager 308 having a pixel array 204 with each pixel cell being constructed as in one of the embodiments described above. Pixel array 204 comprises a plurality of pixels arranged in a predetermined number of columns and rows (not shown), attached to the array 204 is signal processing circuitry, as described herein, at least part of which may be formed in the substrate. The pixels of each row in array 204 are all turned on at the same time by a row select line, and the pixels of each column are selectively output by respective column select lines. A plurality of row and column lines are provided for the entire array 204. The row lines are selectively activated by a row driver 210 in response to row address decoder 220. The column select lines are selectively activated by a column driver 260 in response to column address decoder 270. Thus, a row and column address is provided for each pixel. The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. $V_{rst}$ is read from a pixel immediately after the floating diffusion region 110 is reset out by the reset gate 120; $V_{sig}$ represents the charges transferred by the transfer gate 106, from the photodiode regions 103, 122 to the floating diffusion region. A differential signal ($V_{rst}$-$V_{sig}$) is produced by differential amplifier 262 for each pixel which is digitized by analog to digital converter 275 (ADC). The analog to digital converter 275 supplies the digitized pixel signals to an image processor 280 which forms a digital image.

Figure 9:
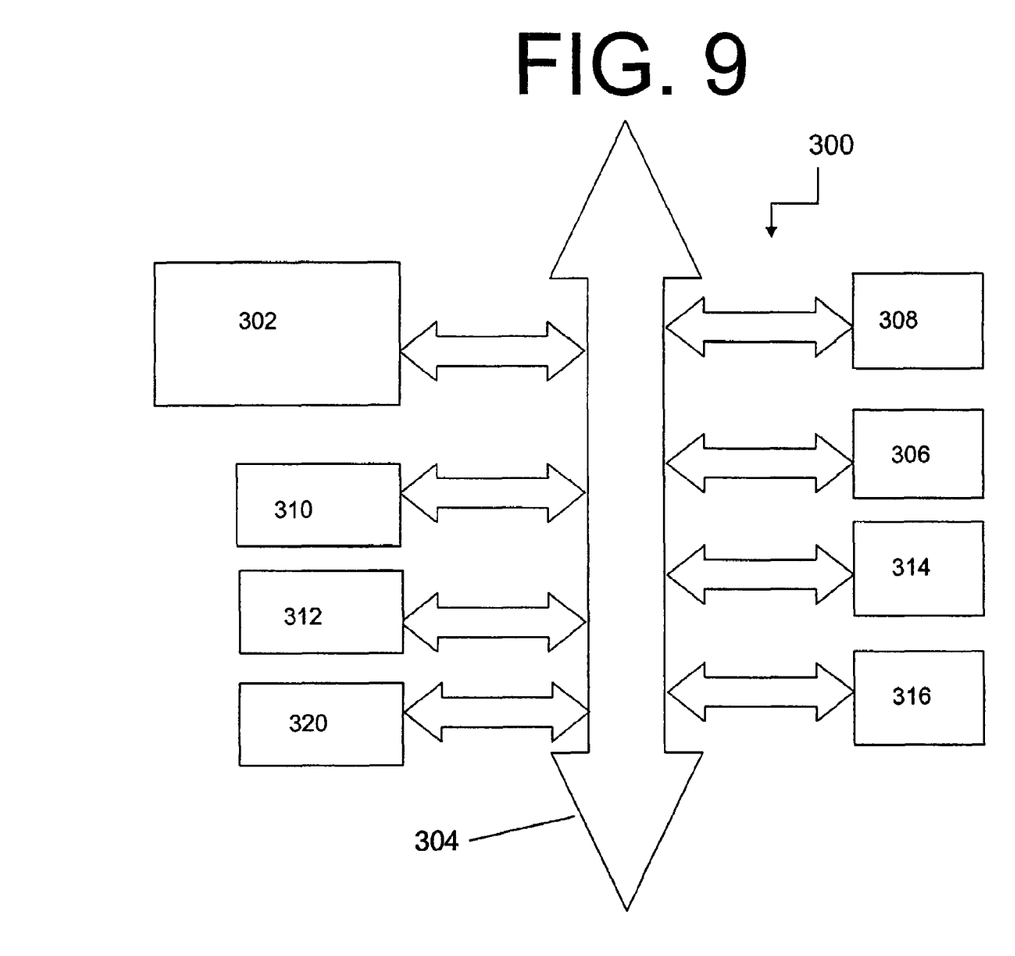
FIG. 9 is a schematic diagram of a processing system employing a CMOS imager having elevated photodiodes constructed in accordance with the present invention.

FIG. 9 shows a processor system 300, which includes an imager 308 constructed in accordance with an embodiment of the invention. The processor system may be part of a digital camera or other imaging system. The imager 308 may receive control or other data from system 300. System 300 includes a processor 302 having a central processing unit (CPU) for image processing, or other image handling operations. The processor 302 communicates with various devices over a bus 304. Some of the devices connected to the bus 304 provide communication into and out of the system 300; an input/output (I/O) device 306 and imager 308 are such communication devices. Other devices connected to the bus 304 provide memory, for instance, a random access memory (RAM) 310 or a flash memory card 320.

The processor system 300 could alternatively be part of a larger processing system, such as a computer. Through the bus 304, the processor system 300 illustratively communicates with other computer components, including but not limited to, a hard drive 312 and one or more peripheral memory devices such as a floppy disk drive 314, a compact disk (CD) drive 316.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. An imager comprising:
   a substrate having a first surface level;
   an array of pixel cells formed partially in said substrate, at least one pixel cell of said array comprising:
   a first photosensor structure formed in said substrate, said first photosensor structure including a first doped region extending to said first surface level; and
   a second photosensor structure formed above said first surface level, said second photosensor structure comprising an epitaxial material formed on said first surface level, and a first hydrogenated amorphous silicon material formed on said epitaxial material.

2. The imager of claim 1, wherein said epitaxial material and said first hydrogenated amorphous silicon material have opposite doping types.

3. The imager of claim 2, wherein said first hydrogenated amorphous silicon material is doped n-type, and said epitaxial material is doped p-type.

4. The imager of claim 1, wherein said epitaxial material is located adjacent a transfer transistor.

5. The imager of claim 4, wherein said epitaxial material is in contact with an oxided sidewall of said transfer transistor.

6. The imager of claim 1, wherein each photosensor further comprises a second hydrogenated amorphous silicon material formed over said first hydrogenated amorphous silicon material.

7. The imager of claim 6, wherein at least one of said first and second hydrogenated amorphous silicon materials further comprises fluorine.

8. The imager of claim 6, wherein at least one of said first and second hydrogenated amorphous silicon materials further comprises deuterium.

9. The imager of claim 1, wherein said pixel cells of said array are CMOS cells.

10. The imager of claim 1, wherein said at least one pixel has a fill factor of at least fifty percent.

11. The imager of claim 2, wherein said first hydrogenated amorphous silicon material is doped p-type, and said epitaxial material is doped n-type.

12. The imager of claim 1, wherein said first and second photosensor structures generate charge carriers in response to applied light.

13. The imager of claim 1, wherein said first photosensor structure is one of a pnp, npn, np, and pn photodiode.

14. The imager of claim 1, said at least one pixel cell further comprising an insulation region surrounding said second photosensor structure.

15. An imager comprising:
a substrate having a first surface level;
an array of pixel cells formed partially in said substrate, at least one pixel cell of said array comprising:
a first photosensor structure formed within said substrate;
a second photosensor structure formed above said first surface level, said second photosensor structure having an epitaxial region formed on said substrate and a first hydrogenated amorphous silicon region formed on said epitaxial region; and
an insulation region surrounding said second photosensor structure.

16. The imager of claim 15, said at least one pixel cell further comprising at least one transistor formed in said substrate, wherein at least a portion of said first photosensor structure extends horizontally above the at least one transistor.

17. The imager of claim 15, wherein said first hydrogenated amorphous silicon material further comprises fluorine.

18. The imager of claim 15, wherein said first hydrogenated amorphous silicon material comprises deuterated amorphous silicon.

19. The imager of claim 15, wherein said at least one pixel cell has a fill factor greater than fifty percent.

20. The imager of claim 15, wherein said imager is a CMOS imager.

21. The imager of claim 15, wherein said imager is a component in a processor system, said processor system further comprising:
a processor coupled to said imager.

22. The imager of claim 15, said second photosensor structure further comprising a second hydrogenated amorphous silicon region formed on said first hydrogenated silicon region.

23. The imager of claim 22, said epitaxial region extending to a second surface level and said second hydrogenated amorphous silicon regions extending to a third surface level, wherein said insulation region extends from said second surface level to said third surface level.

24. The imager of claim 23, wherein said insulation region extends from said first surface level to said third surface level.

25. The imager of claim 15, said first photosensor structure including a first doped region extending to said first surface level.

* * * * *

UNITED STATES PATENT AND TRADEMARK OFFICE
CERTIFICATE OF CORRECTION

| | | |
|---|---|---|
| PATENT NO. | : 7,649,201 B2 | Page 1 of 1 |
| APPLICATION NO. | : 11/399372 | |
| DATED | : January 19, 2010 | |
| INVENTOR(S) | : Chandra Mouli | |

It is certified that error appears in the above-identified patent and that said Letters Patent is hereby corrected as shown below:

In column 9, line 16, in Claim 14, after "claim 1," insert -- wherein --.

In column 9, line 32, in Claim 16, after "claim 15," insert -- wherein --.

In column 10, line 17, in Claim 22, after "claim 15," insert -- wherein --.

In column 10, line 21, in Claim 23, after "claim 22," insert -- wherein --.

In column 10, line 29, in Claim 25, after "claim 15," insert -- wherein --.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,649,201 B2 Page 1 of 1
APPLICATION NO. : 11/399372
DATED : January 19, 2010
INVENTOR(S) : Chandra Mouli It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 612 days.

Signed and Sealed this

Twenty-third Day of November, 2010

David J. Kappos
*Director of the United States Patent and Trademark Office*